United States Patent
Razavi Majomard et al.

(10) Patent No.: US 12,327,774 B1
(45) Date of Patent: Jun. 10, 2025

(54) MEETING PERFORMANCE AND TEMPERATURE REQUIREMENTS IN ELECTRONIC CIRCUITS

(71) Applicant: Marvell Asia Pte Ltd, Singapore (SG)

(72) Inventors: Seid Alireza Razavi Majomard, Belmont, CA (US); Viswakiran Popuri, Milpitas, CA (US); David Shen, Saratoga, CA (US)

(73) Assignee: Marvell Asia Pte Ltd, Singapore (SG)

( * ) Notice: Subject to any disclaimer, the term of this patent is extended or adjusted under 35 U.S.C. 154(b) by 491 days.

(21) Appl. No.: 17/750,347

(22) Filed: May 22, 2022

Related U.S. Application Data

(60) Provisional application No. 63/192,429, filed on May 24, 2021.

(51) Int. Cl.
  *H01L 23/34* (2006.01)
  *G05D 23/19* (2006.01)

(52) U.S. Cl.
  CPC ......... *H01L 23/34* (2013.01); *G05D 23/1919* (2013.01)

(58) Field of Classification Search
  CPC ... H01L 23/34; H01L 25/072; H01L 25/0652; H01L 25/0655; H01L 23/38; G05D 23/1919; G05D 23/1905; G05D 23/1917; H05K 1/0203; H05K 1/181; H05K 2201/10159; H05K 2201/10515; H05K 2201/10522; H05K 2201/10409; H05K 2201/10219; H05K 2201/066; G06F 1/3296; G06F 1/206; G06F 1/3287; G06F 1/3206; G06F 1/3209; G06F 1/324; G06F 11/3485; G06F 1/3268; G06F 11/3034; G06F 11/3409; G06F 11/3058; G06F 1/3275; G06F 3/0688; G06F 11/3075; G06F 3/0653; G06F 11/3037; G06F 3/0614; G06F 11/076; G06F 2201/81; F25B 21/02; F25B 2321/0212; F25B 2321/021; Y02D 10/00; G08C 17/00; G08C 17/02; F24F 11/30; F24F 11/62; F24F 11/38; F24F 11/56; F24F 11/61; F24F 2140/60; F24F 2110/10; H04W 4/38; H04W 4/33; H04W 24/02; G01R 19/2503; G01K 13/00; G01K 7/00; G01K 15/005; G01K 1/14; G01K 7/01; G01K 2219/00; H04Q 9/00; G11B 5/012; G11B 5/02; G11B 7/1267;
  (Continued)

(56) References Cited

U.S. PATENT DOCUMENTS 9,093,127 B1   7/2015 Solt
9,411,400 B1 * 8/2016 Dropps ................... G06F 1/206
  (Continued)

*Primary Examiner* — Mouloucoulaye Inoussa
(74) *Attorney, Agent, or Firm* — Meitar Patents Ltd.; Daniel Kligler

(57) ABSTRACT

An Integrated Circuit (IC) includes an electronic circuit and a controller. The electronic circuit is designed to operate at temperatures above a specified minimal temperature. The IC has a controllable operational parameter that affects a performance measure of the electronic circuit and an amount of heat produced by the electronic circuit. The controller is configured to control the operational parameter so as to meet both requirements concurrently: (i) exceeding a specified minimal performance level of the performance measure, and (ii) a local temperature of the electronic circuit exceeding the specified minimal temperature.

20 Claims, 2 Drawing Sheets

P3 MEETS BOTH PERFORMANCE AND TEMPERATURE REQUIREMENTS

(58) Field of Classification Search
CPC ... G11B 2005/0021; G11C 16/06; G11C 7/04; G11C 11/40626; G11C 2207/2227
See application file for complete search history.

(56) References Cited

U.S. PATENT DOCUMENTS

| | | | | |
|---|---|---|---|---|
| 2004/0047099 | A1* | 3/2004 | Pippin | G06F 11/3024 361/103 |
| 2011/0255353 | A1* | 10/2011 | Fukushima | G11C 7/04 365/191 |
| 2014/0195577 | A1* | 7/2014 | Nikitin | H03H 11/1256 708/304 |
| 2015/0024287 | A1* | 1/2015 | Duncan | H01M 8/04037 429/403 |
| 2016/0033975 | A1* | 2/2016 | Mittal | G06F 1/206 700/300 |
| 2016/0066300 | A1* | 3/2016 | McCABE | G06F 1/206 370/329 |
| 2017/0176981 | A9* | 6/2017 | Gao | G05B 19/416 |
| 2018/0316424 | A1* | 11/2018 | Gohel | G01K 13/00 |
| 2018/0356111 | A1* | 12/2018 | Salsbury | G08C 17/00 |
| 2019/0041926 | A1* | 2/2019 | Guy | H04L 45/14 |
| 2019/0245549 | A1* | 8/2019 | Nikitin | H03H 17/0219 |
| 2020/0011741 | A1* | 1/2020 | Cirit | G01R 19/2503 |
| 2020/0050246 | A1* | 2/2020 | Karalnik | H05K 1/0203 |
| 2020/0075063 | A1* | 3/2020 | Lovett | G11C 7/22 |
| 2020/0135233 | A1* | 4/2020 | Oberg | G11B 5/012 |
| 2021/0258804 | A1* | 8/2021 | Amini | H04W 24/02 |
| 2021/0342242 | A1* | 11/2021 | Ohno | G06F 11/3058 |
| 2022/0261326 | A1* | 8/2022 | Byun | G06F 11/3485 |
| 2022/0373402 | A1* | 11/2022 | Wyatt | G01N 27/121 |

* cited by examiner

MEETING PERFORMANCE AND TEMPERATURE REQUIREMENTS IN ELECTRONIC CIRCUITS

CROSS-REFERENCE TO RELATED APPLICATIONS

This application claims the benefit of U.S. Provisional Patent Application 63/192,429, filed May 24, 2021, whose disclosure is incorporated herein by reference.

FIELD OF THE DISCLOSURE

The present disclosure relates generally to Integrated Circuits (ICs), and particularly to methods and systems for meeting performance and temperature requirements of electronic circuits.

BACKGROUND

Various electronic circuits are designed to operate within specified temperature range. At temperatures outside its designated temperature range, an electronic circuit may perform poorly and even malfunction. Methods for controlling the temperature of electronic circuits are known in the art. For example, U.S. Pat. No. 9,093,127, entitled "Method and apparatus for warming up integrated circuits" which is assigned to the assignee of the present patent application, describes an integrated circuit (IC) chip that includes functional circuits configured to perform desired functions when a chip temperature is higher than a threshold, such as a room temperature. The IC chip includes a warm-up module configured to warm-up the IC chip in a warm-up mode to raise the chip temperature above the threshold. A method for warming up an IC chip prior to operation is also disclosed.

The description above is presented as a general overview of related art in this field and should not be construed as an admission that any of the information it contains constitutes prior art against the present patent application.

SUMMARY

An embodiment that is described herein provides an Integrated Circuit (IC) that includes an electronic circuit and a controller. The electronic circuit is designed to operate at temperatures above a specified minimal temperature. The IC has a controllable operational parameter that affects a performance measure of the electronic circuit and an amount of heat produced by the electronic circuit. The controller is configured to control the operational parameter so as to meet both requirements concurrently: (i) exceeding a specified minimal performance level of the performance measure, and (ii) a local temperature of the electronic circuit exceeding the specified minimal temperature.

In some embodiments, the IC includes a temperature sensor configured to measure the local temperature of the electronic circuit, and the controller is configured to control the operational parameter based at least on a temperature measurement taken by the temperature sensor. In other embodiments, the controller is configured to control the operational parameter independently of the local temperature, based on a predefined relationship between the operational parameter and expected resulting local temperature. In yet other embodiments, the controller is configured to control the operational parameter to adjust both the performance level and the local temperature, in response to detecting that the local temperature of the electronic circuit or an ambient temperature of the IC exceeds a respective specified maximal temperature.

In an embodiment, the operational parameter also affects an amount of power consumed by the electronic circuit, and the controller is configured to measure a power consumed by the IC, and to control the operational parameter to adjust both the performance level and an amount of power consumed by the electronic circuit, in response to detecting that an amount of power consumed by the IC exceeds a predefined maximal power consumption level. In another embodiment, the electronic circuit includes an analog circuit receiving an input signal and producing an output signal, and the controller is configured to control the operational parameter for controlling one or more performance measures selected from a list including: (i) a deviation from a linear relationship between the input signal and the output signal, (ii) a gain between the output signal and the input signal, (iii) an offset of the output signal for a given amplitude of the input signal, (iv) a Signal to Noise Ratio (SNR) of the output signal, and (v) a noise floor level of the electronic circuit. In yet another embodiment, the electronic circuit includes an analog amplifier or an analog filter, and the controller is configured to control the operational parameter by modifying an amount of electrical current provided to the analog circuit.

In some embodiments, the electronic circuit includes an Analog to Digital converter (ADC) or a Digital to Analog Converter (DAC) having a modifiable sampling rate, and the controller is configured to control the operational parameter by modifying the sampling rate of the electronic circuit. In other embodiments, the electronic circuit includes an adaptive digital filter, and the controller is configured to control the operational parameter by modifying an adaptation rate of the adaptive digital filter. In yet other embodiments, the controller is configured to control the operational parameter during or after an initialization phase of the IC.

There is additionally provided, in accordance with an embodiment that is described herein, a method for controlling performance and temperature of an electronic circuit, including, the method in an Integrated Circuit (IC) including an electronic circuit designed to operate at temperatures above a specified minimal temperature, and the IC has a controllable operational parameter that affects a performance measure of the electronic circuit and an amount of heat produced by the electronic circuit, controlling the operational parameter so as to meet both requirements concurrently: (i) exceeding a specified minimal performance level of the performance measure, and (ii) a local temperature of the electronic circuit exceeding the specified minimal temperature.

The present disclosure will be more fully understood from the following detailed description of the embodiments thereof, taken together with the drawings in which:

DETAILED DESCRIPTION OF EMBODIMENTS

Figure 1:
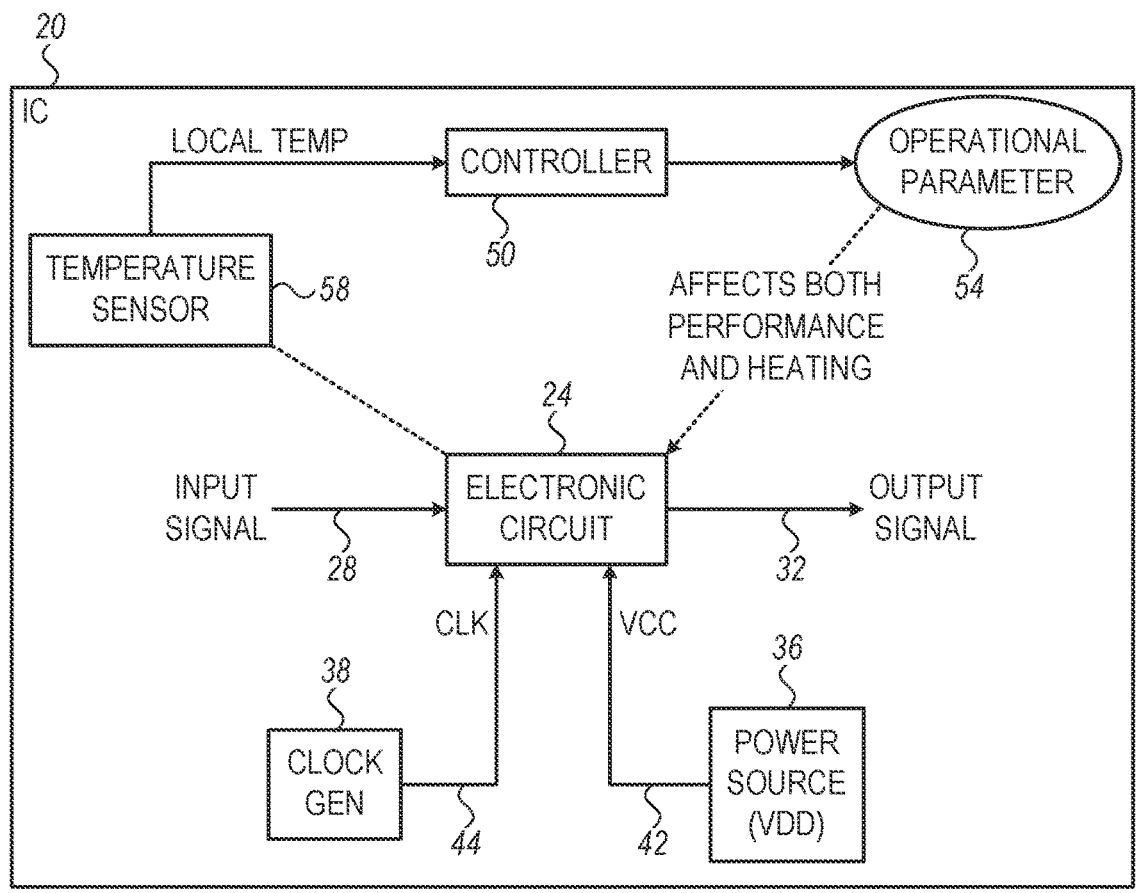
FIG. 1 is a block diagram that schematically illustrates an Integrated Circuit (IC) controlling an operational parameter for meeting performance and temperature requirements of an electronic circuit within the IC, in accordance with an embodiment that is described herein.

Embodiments that are described herein provide methods and circuits for concurrently meeting performance and temperature requirements of an electronic circuit in an Integrated Circuit (IC). In the disclosed embodiments, meeting both requirements is achievable by controlling an operational parameter that affects both the performance of the electronic circuit and the amount of heat the electronic circuit produces.

Electronic circuits typically are designed to operate within a specified temperature range. Various applications such as consumer, military or space applications are typically designated different temperature ranges, e.g., depending on expected environmental temperature, reliability constrains, and the like.

The local temperature of an electronic circuit may vary with time for various reasons, such as ambient temperature variations, the tasks performed by the electronic circuit, and internal heat produced by the electronic circuit and neighboring circuits, to name a few. When the local temperature falls outside the specified temperature range, e.g., below a specified minimal temperature, the electronic circuit may perform poorly or even fail.

In principle, the IC may comprise a heat source for selectively heating up the electronic circuit, e.g., to a temperature above the specified minimal temperature. This approach is not always applicable or advantageous, because a heat source and other circuits that may be involved in controlling the local temperature consume valuable chip area and power. As will be described below, in some embodiments, the local temperature of the electronic circuit is adapted by controlling the amount of thermal heat produced by the electronic circuit itself.

In some embodiments, the IC has a controllable operational parameter that affects both a performance measure of the electronic circuit and an amount of heat produced by the electronic circuit. The IC further comprises a controller, configured to control the operational parameter for meeting both requirements concurrently: (i) exceeding a specified minimal performance level of the performance measure, and (ii) the local temperature of the electronic circuit exceeds a specified minimal temperature.

In an embodiment, the operational parameter affects the performance and heating of the electronic circuit so that modifying the operational parameter for increasing the performance level, also causes the electronic circuit to produce more heat, and modifying the operational parameter for decreasing the performance level, also causes the electronic circuit to produce less heat.

In an embodiment, the IC comprises a temperature sensor for monitoring the local temperature of the electronic circuit, and the controller is configured to control the operational parameter based at least on temperature measurement(s) taken by the temperature sensor. In another embodiment, (e.g., when the IC does not include a temperature sensor) the controller controls the operational parameter independently of the local temperature, e.g., based on a predefined relationship between the operational parameter and the expected resulting local temperature.

In some embodiments, the controller controls the operational parameter to avoid overheating or excessive power consumption in the IC. In one such embodiment, the controller controls the operational parameter to reduce both the performance level and the local temperature, in response to detecting that the local temperature of the electronic circuit or an ambient temperature of the IC exceeds a respective specified maximal temperature.

In an embodiment, the operational parameter also affects the amount of power consumed by the electronic circuit. In this embodiment, the controller measures the amount of power consumed by the IC, and controls the operational parameter to reduce both the performance level and the amount of power consumed by the electronic circuit, in response to detecting that the amount of power consumed by the IC exceeds a predefined maximal power consumption level.

The description below includes example analog and digital electronic circuits for which the disclosed embodiments are applicable. Example performance measures and operational parameters suitable for the analog and digital circuits are also described.

In the disclosed techniques, an IC comprising an electronic circuit has an operational parameter that affects both (i) a performance measure of the electronic circuit, and (ii) the amount of heat produced by the electronic circuit. The operational parameter is controlled so that the electronic circuit meets both performance and temperature requirements concurrently. The disclosed embodiments are implementable with low complexity, requiring only small chip area and low power.

FIG. 1 is a block diagram that schematically illustrates an Integrated Circuit (IC) 20 controlling an operational parameter for meeting performance and temperature requirements of an electronic circuit within the IC, in accordance with an embodiment is described herein.

IC 20 may comprise any suitable electronic device or system, used in any suitable application. For example, IC 20 may be applicable in computer systems, storage systems, enterprise networking, wired and mobile communication systems, automotive applications, consumer electronics, military applications, space applications, and many more.

IC 20 comprises an electronic circuit 24 receiving an input signal 28 and outputting an output signal 32. The electronic circuit typically applies some desired function to the input signal for producing the output signal, as required by the functionality of the IC. Each of the input signal and the output signal may connect to one or more circuits within the IC, or to one or more circuits external to the IC. Electronic circuit 24 may comprise an analog circuit, a digital circuit, or a combination of analog and digital circuits. Example relevant electronic circuits will be described further below. In the present context and in the claims, an Analog to Digital Converter (ADC) and a Digital to Analog Converter (DAC) are classified as analog circuits.

In the example of FIG. 1, IC 20 comprises a power source 36. Power source 36 provides a supply voltage 42 (denoted VCC) to electronic circuit 24 and possibly to other circuits in IC 20. In an embodiment, power source 36 generates supply voltage 42 from a VDD voltage provided by an external power source (not shown). Although in FIG. 1, power source 36 resides within IC 20, in other embodiments power source 36 (or part of the power source) resides externally to IC 20. In the example embodiment of FIG. 1, IC 20 comprises a clock generator 38 that generates a clock signal 44 (denoted CLK) required by electronic circuit 24 for performing synchronous operations internally and/or with synchronization with other circuits. In alternative embodiments, some (or all) of the functionality of IC 20 is implemented using asynchronous circuits.

IC 20 comprises a controller 50, configured to control one or more operational parameters 54 of the IC. The controlled operational parameter affects a performance measure of electronic circuit 24 and an amount of heat produced by the electronic circuit. In some embodiments, modifying the operational parameter for increasing the performance level of the performance measure, also causes the electronic circuit to produce more heat. Similarly, modifying the operational parameter for decreasing the performance level of the performance measure, also causes the electronic circuit to produce less heat.

In some embodiments, electronic circuit 24 is required to operate both above a predefined performance level of the performance measure, and within a specified temperature range. In such embodiments, controller 50 controls operational parameter 54 so that the electronic circuit meets both the performance and temperature requirements concurrently.

In some embodiments, IC 20 comprises a temperature sensor 58, configured to measure the local temperature of electronic circuit 24, and reports the measured temperature to controller 50, which controls the operational parameter, based at least on the measured local temperature.

In some embodiments the electronic circuit comprises an analog circuit such as an amplifier, an analog filter, an Analog to Digital Converter (ADC) or a Digital to Analog Converter (DAC). The performance measure of the analog circuit may comprise, for example, one or more of: linearity, gain, offset, Signal to Noise Ratio (SNR), and noise floor. An analog circuit may comprise, for example, a Programable Gain Amplifier (PGA) whose output is provided to an ADC, in an embodiment.

In some embodiments the electronic circuit comprises a digital circuit such as, for example, an adaptive digital filter. In such embodiments, the operational parameter may comprise the adaptation rate of the digital filter. At high adaptation rates, the performance of the digital filter improves, and its temperature increases, compared to low adaptation rates.

In some embodiments, the electronic circuit comprises synchronous elements, e.g., multiple interconnected digital flip-flop elements that are clocked based on a suitable clock signal (e.g., CLK 44). Such an electronic circuit is required to meet timing constraints across the specified temperature range. In such embodiments, the performance measure comprises an ability to meet timing requirements of synchronous elements in the electronic circuit.

In embodiments in which the electronic circuit comprises an analog circuit, controller 50 may control operational parameter 54 by modifying the amount of electrical current provided to the analog circuit. For example, increasing the electrical current may result in improved performance level of the analog circuit but also causes the analog circuit to produce more heat.

For an analog electronic circuit comprising an ADC or a DAC having a modifiable sampling rate, controller 50 may control operational parameter 54 by modifying the sampling rate of the ADC or DAC, in an embodiment. Increasing the sampling rate results in both improving the ADC or DAC performance and increasing its local temperature. It is noted that in some applications, however, the sampling rate of an ADC and/or DAC is fixed and cannot be modified, in which case an operational parameter that modifies the sampling rate of ADC or DAC cannot be used.

In some embodiments, the electronic circuit comprises an adaptive digital filter whose filtering properties (e.g., impulse response of frequency response) can be adapted over time, e.g., by updating filter's coefficients. In such embodiments, controller 50 may control operational parameter 54 by modifying the adaptation rate of the adaptive digital filter, so that at high adaptation rates, the performance of the digital filter improves (because it is updated more frequently), and its temperature increases, compared to low adaptation rates.

The performance level and local temperature of the electronic circuit may depend on the operational parameter in various ways. Examples of such dependences are next described.

Figure 2:
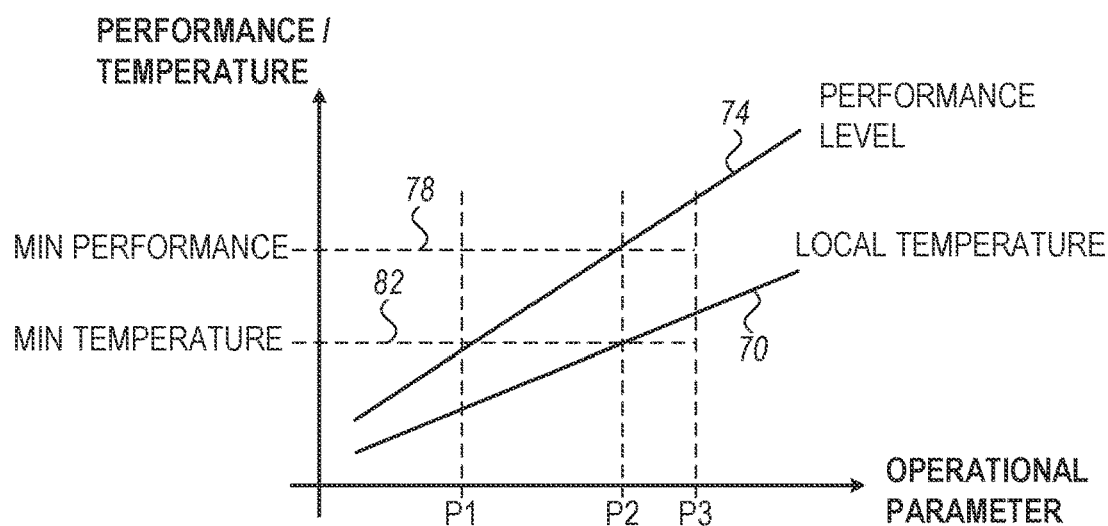
FIG. 2 is a diagram that schematically illustrates example relationships between an operational parameter and (i) performance level of an electronic circuit, and (ii) local temperature of an electronic circuit, in accordance with an embodiment that is described herein.

FIG. 2 is a diagram that schematically illustrates example relationships between an operational parameter and (i) performance level of an electronic circuit, and (ii) local temperature of an electronic circuit, in accordance with an embodiment that is described herein. The relationships depicted in FIG. 2, may be applicable in IC 20 of FIG. 1 above.

In the diagram of FIG. 2, the horizontal axis corresponds to operational parameter 54, and the vertical axis corresponds to the performance level and local temperature of electronic circuit 24.

The diagram depicts a temperature line 70 and a performance level line 74, showing respective dependences of the local temperature and performance level on the operational parameter. In the present example, both the local temperature and performance level increase linearly with the operational parameter. Alternatively, other types of dependences (e.g., nonlinear dependences, or temperature and performance level lines that decrease with increasing the operational parameter) can also be used.

In FIG. 2, dotted lines 78 and 82 are indicative of respective minimal performance level and minimal local temperature requirements. Consider operational parameter values on the horizontal axis, denoted P1, P2 and P3. Below P1, both the local temperature and performance level fall below their respective minimal temperature and performance level requirements. Between P1 and P2, the performance level requirement is met, but the local temperature is still below the specified minimal temperature. When the operational parameter is set above P2, e.g., to P3, both the performance level and temperature requirements are met. In the present example, controller 50 may set operational parameter 54 to any value above P2, e.g., to P3.

Figure 3:
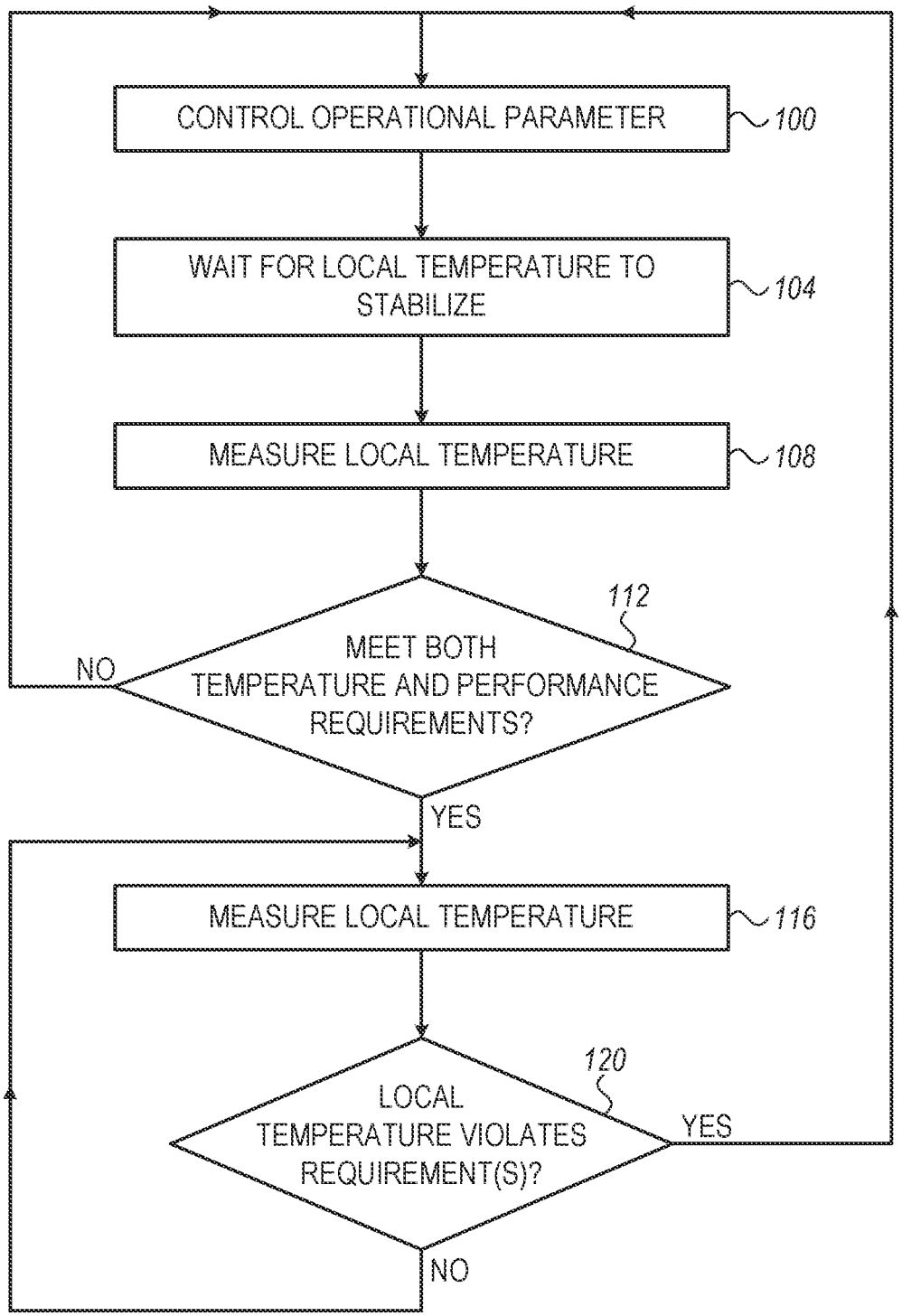
FIG. 3 is a flow chart that schematically illustrates a method for controlling an operational parameter for meeting both performance level and local temperature requirements of an electronic circuit, in accordance with an embodiment that is described herein.

FIG. 3 is a flow chart that schematically illustrates a method for controlling an operational parameter for meeting both performance level and local temperature requirements of an electronic circuit, in accordance with an embodiment that is described herein. The method will be described as executed by controller 50 in IC 20 of FIG. 1. It is assumed that controller 50 is provisioned with a minimal performance level requirement and with a minimal local temperature requirement, specified for electronic circuit 24.

The method begins with controller 50 controlling operational parameter 54, at an operational parameter setting operation 100. When operation 100 is first visited (e.g., after initialization), the controller may set the operational parameter to some predefined initial value, or for meeting only one of the performance level and temperature requirements, in an embodiment. When operation 100 is revisited (as will be described below), the controller sets the value of the operational parameter, for example, based at least on the local temperature of the electronic circuit, as measured by temperature sensor 58.

At a waiting operation 104, the controller waits for the local temperature of the electronic circuit to stabilize after the operational parameter has been modified at operation 100. For example, in one embodiment, controller 50 identifies that the local temperature has stabilized based on one or more temperature measurements taken by temperature sensor 58. In another embodiment, the controller waits for a predefined period before proceeding to the next operation.

At a temperature measurement operation 108, controller 50 measures the local temperature of electronic circuit 24 using temperature sensor 58. At a requirement checking operation 112, the controller checks whether both temperature and performance requirements are met, e.g., based on predefined dependencies between the operational parameter and the performance and temperature requirements (e.g., as in FIG. 2). If at least one of the performance and temperature requirements is not met at operation 112, the controller loops back to operation 100 to further modify the operational parameter. Otherwise, the controller proceeds to track temperature variations at operations 116 and 120 as described herein.

At a temperature measurement operation 116, the controller takes one or more measurements of the local temperature of electronic circuit 24. At a violation checking operation 120, the controller checks, based on the one or more temperature measurements of operation 116, whether the minimal temperature requirement is violated, and if so, loops back to operation 100 to further control the operational parameter. Otherwise, the controller loops back to operation 116 to continue tracking local temperature variations.

In the method of FIG. 3, at operations 116 and 120, the controller tracks the local temperature to check whether the operational parameter needs to be updated. In alternative embodiments, e.g., when temperature may also affect the performance level for a given setting of the operational parameter, the controller tracks both temperature and performance level, in an embodiment.

Next are described additional embodiments that are applicable, e.g., in IC 20 of FIG. 1.

In some embodiments, the temperature range specified for IC 20 and or electronic circuit 24 includes a respective maximal temperature requirement. In such embodiments, the controller controls the operational parameter to reduce both the performance level and the local temperature, in response to detecting that the local temperature of the electronic circuit or an ambient temperature of the IC exceeds the respective specified maximal temperature.

In some embodiments, the operational parameter also affects the amount of power consumed by the electronic circuit. For example, adjustment of the operational parameter, which results in increasing the local temperature, typically also results in increased power consumption. In an embodiment, controller 50 measures the amount of power consumed by the IC (e.g., from power source 36), and controls the operational parameter to reduce both the performance level and the amount of power consumed by the electronic circuit in response to detecting that the amount of power consumed by the IC exceeds a predefined maximal power consumption level.

As noted above, e.g., with reference to FIG. 1, the electronic circuit may comprise an analog circuit receiving an input signal and producing an output signal. In this case, controller 50 controls the operational parameter for controlling one or more performance measures selected from a list comprising: (i) a deviation from a linear relationship between the input signal and the output signal, (ii) a gain between the output signal and the input signal, (iii) an offset of the output signal for a given amplitude of the input signal, (iv) a Signal to Noise Ratio (SNR) of the output signal, and (v) a noise floor level of the electronic circuit.

In some embodiments, the electronic circuit comprises an analog circuit such as an analog amplifier or an analog filter. In some analog circuits of this sort, linearity and noise floor level can be improved by increasing the amount of electrical current provided to the analog circuit, which also increases the amount of heat produced by the analog circuit. In an embodiment comprising an analog circuit, the controller controls the operational parameter by modifying an amount of electrical current provided to the analog circuit.

In another embodiment, the electronic circuit comprises an Analog to Digital Converter (ADC), whose noise floor reduces with the ADC sampling rate, and the amount of heat produced by the ADC increases with the sampling rate. In this embodiment, the controller controls the operational parameter by modifying the sampling rate of the ADC. It is noted that the embodiment of controlling the sampling rate may not be applicable when the sampling rate of the ADC cannot be modified. Controlling the sampling rate for improving performance and increasing local temperature is similarly applicable to a Digital to Analog Converter (DAC) electronic circuit, when the sampling rate is modifiable.

In some embodiments, electronic circuit 24 comprises a digital circuit comprising synchronous elements derived by a clock signal (e.g., CLK 44), e.g., flip-flop elements.

In some embodiments, the controller controls the operational parameter during or after an initialization phase that the IC undergoes, e.g., upon power up, wakeup from a low power mode, or a reset procedure. The initialization phase may include initialization procedures such as calibration of analog circuits, and/or link establishment including adapting coefficients of adaptive digital filters such as a channel equalizer or a digital echo canceler.

The configuration of IC 20 and its components, such as electronic circuit 24 and controller 50, as shown in FIG. 1 is an example configuration that is depicted solely for the sake of clarity. In alternative embodiments, any other suitable IC configurations can be used.

The different elements of C 20 and its components may be implemented using dedicated hardware or firmware, such as using hard-wired or programmable logic, e.g., in an Application-Specific Integrated Circuit (ASIC) or Field-Programmable Gate Array (FPGA). Additionally, or alternatively, some functions of IC 20, e.g., functions of controller 50, may be implemented in software and/or using a combination of hardware and software elements. Elements that are not mandatory for understanding of the disclosed techniques have been omitted from the figure for the sake of clarity.

In some embodiments, some functions of IC 20, e.g., functions of controller 50, may be implemented in a programmable processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

The embodiments described above are given by way of example, and other suitable embodiments can also be used. For example, in the IC configuration of FIG. 1, controller 50 controls operational parameter 54 associated with electronic circuit 24, for meeting performance and temperature requirements of the electronic circuit. In other IC configurations, however, multiple electronic circuits in the IC are associated with multiple respective operational parameters and with respective performance and temperature requirements. In such embodiments, the controller controls the multiple operational parameters for meeting respective performance and temperature requirements of the multiple electronic circuits.

Although in the simplified example IC of FIG. 1, electronic circuit 24 is associated with a single operational parameter 54, this is not mandatory. In other embodiments, electronic circuit 24 is associated with multiple operational parameters, affecting multiple respective local temperatures and multiple respective performance measures of the electronic circuit. In these embodiments, the controller modifies two or more of the operational parameters for meeting respective temperature and performance level requirements concurrently.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC) comprising:
an electronic circuit designed to operate at temperatures above a specified minimal temperature, wherein the IC has a controllable operational parameter that affects a performance measure of the electronic circuit and an amount of heat produced by the electronic circuit; and
a controller, configured to receive an indication that a local temperature of the electronic circuit is at or below the specified minimal temperature, and in response thereto control the operational parameter, the operational parameter being one or more operational parameters of linearity, gain, offset, Signal to Noise Ratio (SNR), noise floor, sampling rate, and adaptation rate, to raise the local temperature above the specified minimum temperature.

2. The IC according to claim 1, wherein the IC comprises a temperature sensor configured to measure the local temperature of the electronic circuit, and wherein the controller is configured to control the operational parameter based at least on a temperature measurement taken by the temperature sensor.

3. The IC according to claim 1, wherein the controller is configured to control the operational parameter independently of the local temperature, based on a predefined relationship between the operational parameter and expected resulting local temperature.

4. The IC according to claim 1, wherein the controller is configured to control the operational parameter to adjust both a performance level and the local temperature, in response to detecting that the local temperature of the electronic circuit or an ambient temperature of the IC exceeds a respective specified maximal temperature.

5. The IC according to claim 1, wherein the operational parameter also affects an amount of power consumed by the electronic circuit, and wherein the controller is configured to measure a power consumed by the IC, and to control the operational parameter to adjust both a performance level and an amount of power consumed by the electronic circuit, in response to detecting that an amount of power consumed by the IC exceeds a predefined maximal power consumption level.

6. The IC according to claim 1, wherein the electronic circuit comprises an analog circuit receiving an input signal and producing an output signal, wherein the controller is configured to control the operational parameter for controlling one or more performance measures selected from a list comprising: (i) a deviation from a linear relationship between the input signal and the output signal, (ii) a gain between the output signal and the input signal, (i111) an offset of the output signal for a given amplitude of the input signal, (iv) a Signal to Noise Ratio (SNR) of the output signal, and (v) a noise floor level of the electronic circuit.

7. The IC according to claim 6, wherein the electronic circuit comprises an analog amplifier or an analog filter, and wherein the controller is configured to control the operational parameter by modifying an amount of electrical current provided to the analog circuit.

8. The IC according to claim 6, wherein the electronic circuit comprises an Analog to Digital converter (ADC) or a Digital to Analog Converter (DAC) having a modifiable sampling rate, and wherein the controller is configured to control the operational parameter by modifying the sampling rate of the electronic circuit.

9. The IC according to claim 1, wherein the electronic circuit comprises an adaptive digital filter.

10. The IC according to claim 1, wherein the controller is configured to control the operational parameter during or after an initialization phase of the IC.

11. A method for controlling performance and temperature of an electronic circuit, the method comprising:
in an Integrated Circuit (IC) comprising an electronic circuit designed to operate at temperatures above a specified minimal temperature, wherein the IC has controllable operational parameter that affects a performance measure of the electronic circuit and an amount of heat produced by the electronic circuit:
receiving an indication that a local temperature of the electronic circuit is at or below the specified minimal temperature; and
in response thereto, controlling the operational parameter, the operational parameter being one or more of linearity, gain, offset, Signal to Noise Ratio (SNR), noise floor, sampling rate, and adaptation rate to raise the local temperature above the specified minimum temperature.

12. The method for controlling performance and temperature according to claim 11, wherein controlling the operational parameter comprises controlling the operational parameter based at least on a temperature measurement of the local temperature.

13. The method for controlling performance and temperature according to claim 11, wherein the controller is configured to control the operational parameter independently of the local temperature, based on a predefined relationship between the operational parameter and expected resulting local temperature.

14. The method for controlling performance and temperature according to claim 11, wherein controlling the operational parameter comprises adjusting both a performance level and the local temperature, in response to detecting that the local temperature of the electronic circuit or an ambient temperature of the IC exceeds a respective specified maximal temperature.

15. The method for controlling performance and temperature according to claim 11, wherein the operational parameter also affects an amount of power consumed by the electronic circuit, and comprising measuring a power consumed by the IC, and controlling the operational parameter to adjust both a performance level and an amount of power consumed by the electronic circuit, in response to detecting that an amount of power consumed by the IC exceeds a predefined maximal power consumption level.

16. The method for controlling performance and temperature according to claim 11, wherein the electronic circuit comprises an analog circuit receiving an input signal and producing an output signal, wherein controlling the operational parameter comprises controlling the operational parameter for controlling one or more performance measures selected from a list comprising: (1) a deviation from a linear relationship between the input signal and the output signal, (ii) a gain between the output signal and the input signal, (iii) an offset of the output signal for a given amplitude of the input signal, (iv) a Signal to Noise Ratio (SNR) of the output signal, and (v) a noise floor level of the electronic circuit.

17. The method for controlling performance and temperature according to claim 16, wherein the electronic circuit comprises an analog amplifier or an analog filter, and wherein controlling the operational parameter comprises modifying an amount of electrical current provided to the analog circuit.

18. The method for controlling performance and temperature according to claim 16, wherein the electronic circuit comprises an Analog to Digital converter (ADC) or a Digital to Analog Converter (DAC) having a modifiable sampling rate, and wherein controlling the operational parameter comprises modifying the sampling rate of the electronic circuit.

19. The method for controlling performance and temperature according to claim 11, wherein the electronic circuit comprises an adaptive digital filter, wherein controlling the operational parameter comprises modifying an adaptation rate of the adaptive digital filter.

20. The method for controlling performance and temperature according to claim 11, wherein controlling the operational parameter comprises controlling the operational parameter during or after an initialization phase of the IC.

\* \* \* \* \*